United States Patent
Byeon

(10) Patent No.: US 8,139,422 B2
(45) Date of Patent: Mar. 20, 2012

(54) BUFFER CIRCUIT OF SEMICONDUCTOR MEMORY APPARATUS

(75) Inventor: Sang-Jin Byeon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 310 days.

(21) Appl. No.: 12/494,831

(22) Filed: Jun. 30, 2009

(65) Prior Publication Data

US 2010/0118619 A1 May 13, 2010

(30) Foreign Application Priority Data

Nov. 13, 2008 (KR) .................. 10-2008-0112686

(51) Int. Cl.
*G11C 7/00* (2006.01)
(52) U.S. Cl. .......... 365/189.05; 365/189.07; 365/189.09
(58) Field of Classification Search .............. 365/189.05, 365/189.07, 189.08, 189.09, 191
See application file for complete search history.

(56) References Cited

U.S. PATENT DOCUMENTS

| 5,999,032 | A | 12/1999 | Wang et al. |
| 7,161,513 | B2 | 1/2007 | Werner et al. |
| 7,269,212 | B1 | 9/2007 | Chau et al. |
| 7,542,507 | B2 | 6/2009 | Sohn |
| 7,635,990 | B1 * | 12/2009 | Ren et al. .................. 326/86 |
| 2007/0089009 | A1 | 4/2007 | Nishizawa |
| 2010/0109735 | A1 * | 5/2010 | Lee ........................... 327/288 |

FOREIGN PATENT DOCUMENTS

KR 1020060101747 9/2006
KR 1020080061957 7/2008

* cited by examiner

*Primary Examiner* — Richard Elms
*Assistant Examiner* — Hien Nguyen
(74) *Attorney, Agent, or Firm* — Venable LLP; Jeffri A. Kaminski

(57) ABSTRACT

A buffer circuit of a semiconductor memory apparatus includes a compensation voltage generation unit configured to generate a compensation voltage in response to a level of a reference voltage; and a buffering unit configured to generate an output signal by buffering an input signal depending on the reference voltage and control a transition section of the output signal depending on a level of the compensation voltage.

36 Claims, 7 Drawing Sheets

BUFFER CIRCUIT OF SEMICONDUCTOR MEMORY APPARATUS

CROSS-REFERENCES TO RELATED PATENT APPLICATION

The present application claims priority under 35 U.S.C 119(a) to Korean Application No. 10-2008-0112686, filed on Nov. 13, 2008, in the Korean Intellectual Property Office, which is incorporated herein by reference in its entirety as set forth in full.

BACKGROUND

1. Technical Field

The embodiment described herein relates to a semiconductor memory apparatus and, more particularly, to a buffer of the semiconductor memory apparatus.

2. Related Art

A buffer in a semiconductor memory apparatus serves to amplify, compare, or transmit signals.

The buffer circuit that performs the roles is implemented as first to fifth transistors P1, P2, and N1 to N3 in the form of a current mirror as shown in FIG. 1.

In the case of the buffer circuit, a voltage level of an output signal 'outb' is determined depending on whether a voltage level of an input signal 'in' is higher or lower than a level of a reference voltage 'Vref'. For example, the buffer circuit outputs the output signal 'outb' of a low level when the voltage level of the input signal 'in' is higher than the level of the reference voltage 'Vref' and outputs the output signal 'outb' of a high level when the voltage level of the input signal 'in' is lower than the level of the reference voltage 'Vref'.

Since the buffer circuit determines the voltage level of the output signal 'outb' by comparing the voltage level of the input signal 'in' with the level of the reference voltage 'Vref', a level transition temporal variation of the output signal 'outb' is generated depending on variation of the level of the reference voltage 'Vref'. More specifically, when the level of the reference voltage 'Vref' increases, a large amount of current is supplied to an output node node_A that outputs the output signal 'outb', such that a transition section of the output signal 'outb' is shortened and when the level of the reference voltage 'Vref' decreases, a small amount of current is supplied to the output node node_A, such that the transition section of the output signal 'outb' is lengthened. If the input signal 'in' is a clock signal, a problem in the transition section variation of the output signal 'outb' becomes more serious.

SUMMARY

Embodiments of the invention provide a buffer circuit of a semiconductor memory apparatus that can normally buffer an input signal irrespective of level variation of a reference voltage.

In one embodiment, a buffer circuit of a semiconductor memory apparatus includes a compensation voltage generation unit configured to generate a compensation voltage in response to a level of a reference voltage; and a buffering unit configured to generate an output signal by buffering an input signal depending on the reference voltage and control a transition section of the output signal depending on a level of the compensation voltage.

In another embodiment, a buffer circuit of a semiconductor memory apparatus includes a control voltage generation unit configured to generate a control voltage of which a voltage level decreases as an external voltage is higher than a tolerance voltage level; and a buffering unit configured to generate an output signal by buffering an input signal depending on a reference voltage and increase an amount of supplied current as the level of the control voltage decreases.

In yet another embodiment, a buffer circuit of a semiconductor memory apparatus includes a voltage generation unit configured to generate a compensation voltage depending on variation of a level of a reference voltage when an external voltage is at a voltage level within a tolerance and generate a control voltage when the external voltage is at a voltage level larger than the tolerance; and a buffering unit configured to generate an output signal by buffering an input signal depending on the reference voltage and control an amount of current that flows in the buffering unit depending on at least one of the compensation voltage and the control voltage.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 2:
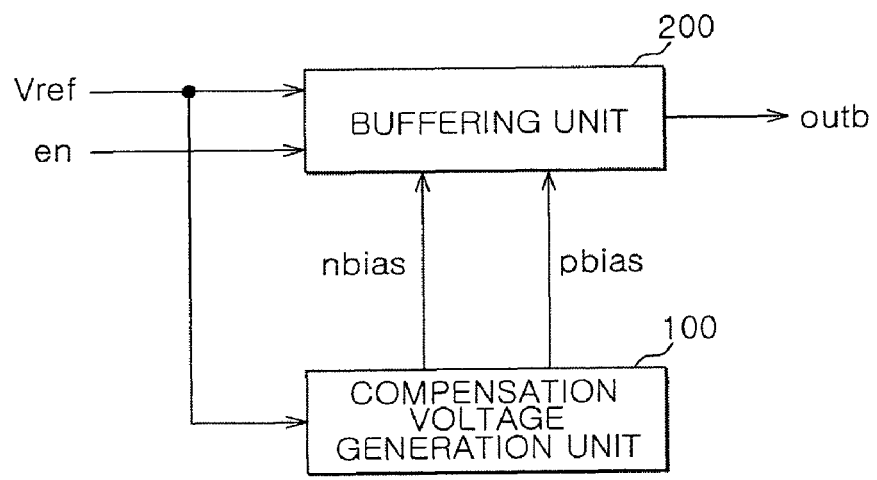
FIG. 2 is a schematic configuration diagram of an exemplary buffer circuit of a semiconductor memory apparatus according to one embodiment.

A buffer circuit of a semiconductor memory apparatus according to one embodiment can be configured to include a compensation voltage generation unit 100 and a buffering unit 200 as shown in FIG. 2.

The compensation voltage generation unit 100 is configured to generate first and second compensation voltages 'nbias' and 'pbias' in response to a level of a reference voltage 'Vref'.

The buffering unit 200 is configured to generate an output signal 'outb' by receiving the reference voltage 'Vref' and buffering an input signal 'in' and control a transition section of the output signal 'outb' depending on levels of the first and second compensation voltages 'nbias' and 'pbias'.

Figure 3:
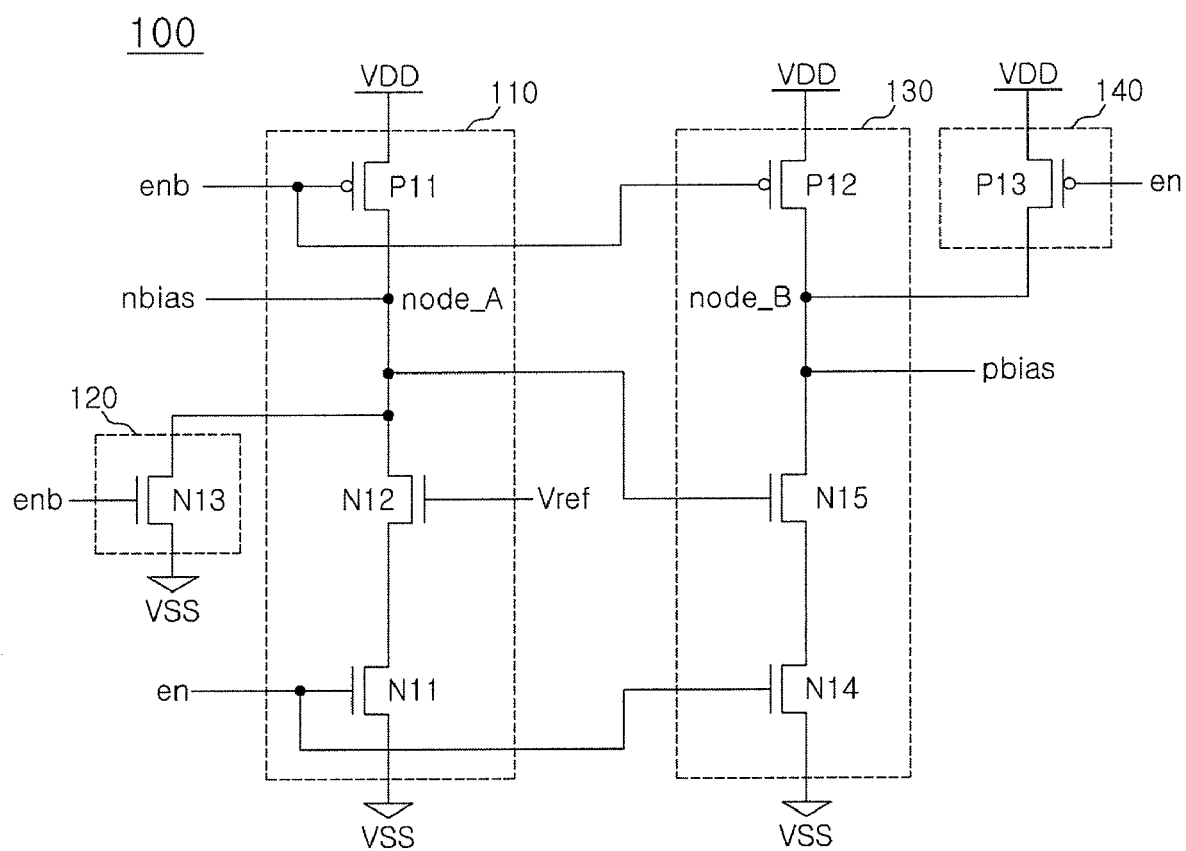
FIG. 3 is a configuration diagram of an exemplary compensation voltage generation unit of FIG. 2 according to one embodiment.

As shown in FIG. 3, the compensation voltage generation unit 100 can be configured to include a first compensation voltage generation unit 110, a first initialization unit 120, a second compensation voltage generation unit 130, and a second initialization unit 140. At this time, an inverted enable signal 'enb' is a signal inverting a level of an enable signal 'en'.

The first compensation voltage generation unit 110 can be configured to include first to third transistors P11, N11, and N12. In the case in which the enable signal 'en' is enabled at a high level, the first compensation voltage generation unit 110 is configured to decrease the level of the first compensation voltage 'nbias' when a level of the reference voltage 'Vref' increases and increase the level of the first compensation voltage 'nbias' when the level of the reference voltage 'Vref' decreases. At this time, the first compensation voltage 'nbias' is outputted from a first node node_A that is connected with first and third transistors P11 and N12.

The first initialization unit 120 can be configured to include a fourth transistor N13. The first initialization unit 120 can connect a ground terminal VSS to the first node node_A when the enable signal 'en' is disabled, that is, the inverted enable signal 'enb' is enabled. That is, the first initialization unit 120 can initialize the first compensation voltage 'nbias' to a level of the ground terminal VSS when the inverted enable signal 'enb' is enabled.

The second compensation voltage generation unit 130 can be configured to include fifth to seventh transistors P12, N14, and N15. In the case in which the enable signal 'en' is enabled, the second compensation voltage generation unit 130 is configured to increase the level of the second compensation voltage 'pbias' when the level of the reference voltage 'Vref' increases and decrease the level of the second compensation voltage 'pbias' when the level of the reference voltage 'Vref' decreases. For example, the second compensation voltage generation unit 130 can be configured to generate the second compensation voltage 'pbias' depending on variation of a voltage level of the first node node_A in which the voltage level varies depending on the level of the reference voltage 'Vref'. At this time, the second compensation voltage 'pbias' is outputted from a second node node_B that is connected with the fifth and seventh transistors 'P12' and 'N15'.

The second initialization unit 140 can be configured to include an eighth transistor P13. The second initialization unit 140 can connect an external voltage VDD to the second node node_B when the enable signal 'en' is disabled. That is, the second initialization unit 140 can initialize the second compensation voltage 'pbias' to a level of the external voltage terminal VDD when the enable signal 'en' is disabled.

Figure 4:
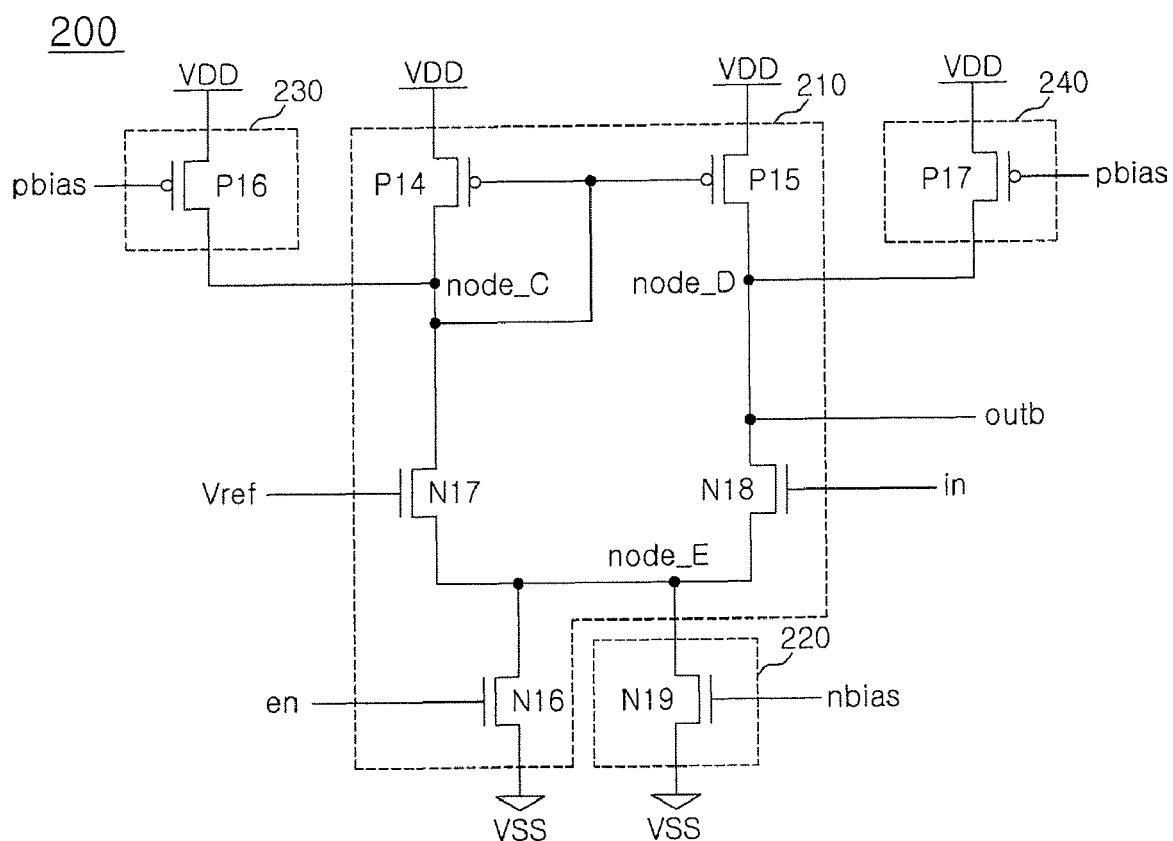
FIG. 4 is a configuration diagram of an exemplary buffering unit of FIG. 2 according to one embodiment.

As shown in FIG. 4, the buffering unit 200 can be configured to include a buffer 210, a current sink unit 220, and first and second current source units 230 and 240.

The buffer 210 having a current mirror structure, which includes ninth to thirteenth transistors P14, P15, and N16 to N18 is configured to generate the output signal 'outb' by buffering the input signal 'in' in accordance with the reference voltage 'Vref'.

The current sink unit 220 increases an amount of current that flows to the ground terminal VSS from the buffer 210 when the level of the first compensation voltage 'nbias' increases. Meanwhile, the current sink unit 220 decreases the amount of current that flows to the ground terminal VSS from the buffer 210 when the level of the first compensation voltage 'nbias' decreases.

The current sink unit 220 can be configured to include a fourteenth transistor N19. The current sink unit 220 is configured to control an amount of current that flows to the ground terminal VSS from a fifth node node_E depending on the level of the first compensation voltage 'nbias'.

The first current source unit 230 can increase the amount of current that is supplied to the buffer 210 when the level of the second compensation voltage 'pbias' decreases. Meanwhile, the first current source unit 230 can decrease the amount of current that is supplied to the buffer 210 when the level of the second compensation voltage 'pbias' increases.

The first current source unit 230 can be configured to include a fifteenth transistor P16. The first current source unit 230 is configured to control an amount of current that flows to a third node node_C from the external voltage terminal VDD depending on the level of the second compensation voltage 'pbias'.

The second current source unit 240 can increase the amount of current that is supplied to the buffer 210 when the level of the second compensation voltage 'pbias' decreases. Meanwhile, the first current source unit 230 can decrease the amount of current that is supplied to the buffer 210 when the level of the second compensation voltage 'pbias' increases.

The second current source unit 240 can be configured to include a sixth transistor P17. The second current source unit 240 is configured to control an amount of current that flows to a fourth node node_D from the external voltage terminal VDD depending on the level of the second compensation voltage 'pbias'.

An exemplary operation of the buffer circuit of the semiconductor memory apparatus according to one embodiment will be described below.

The compensation voltage generation unit 100 can increase the level of the first compensation voltage 'nbias' and decrease the level of the second compensation voltage 'pbias' when the level of the reference voltage 'Vref' decreases.

The buffering unit 200 can increase the amount of current that flows to the ground terminal VSS from the buffering unit 200 when the level of the first compensation voltage 'nbias' increases and increase the amount of current that is supplied to the buffering unit 200 when the level of the second compensation voltage 'pbias' decreases. That is, when the level of the first compensation voltage 'nbias' increases and the level of the second compensation voltage 'pbias' decreases, an amount of current that flows in the buffering unit 200 increases.

The buffering unit 200 can decrease the transition section of the output signal 'outb' as the amount of current that flows in the buffering unit 200 increases.

The compensation voltage generation unit 100 can decrease the level of the first compensation voltage 'nbias' and increase the level of the second compensation voltage 'pbias' when the level of the reference voltage 'Vref' increases.

When the level of the first compensation voltage 'nbias' decreases and the level of the second compensation voltage 'pbias' increases, the amount of current that flows in the buffering unit 200 decreases.

The buffering unit 200 can increase the transition section of the output signal 'outb' as the amount of current that flows in the buffering unit 200 decreases.

The known buffer circuit has a problem in that when the level of the reference voltage 'Vref' decreases, the transition section of the output signal 'outb' is lengthened and when the level of the reference voltage 'Vref' increases, the transition section of the output signal 'outb' is shortened. The problem is generated because the amount of current that flows in the buffer circuit decreases when the level of the reference voltage 'Vref' decreases and the amount of current that flows in the buffer circuit increases when the level of the reference voltage 'Vref' increases. However, the buffering unit 200 can include the current sink unit 220, and the first and second current source units 230 and 240 to supply additional current to the buffer 210 when the level of the reference voltage 'Vref' decreases and prevent an amount of current that flows in the buffer 210 from being increased when the level of the reference voltage 'Vref' increases.

Consequently, since the exemplary buffer circuit of the semiconductor memory apparatus can constantly control the amount of current that flows in the buffering unit depending on the level of the reference voltage, the buffer circuit can generate an output signal having a constant transition section irrespective of the level variation of the reference voltage.

Figure 5:
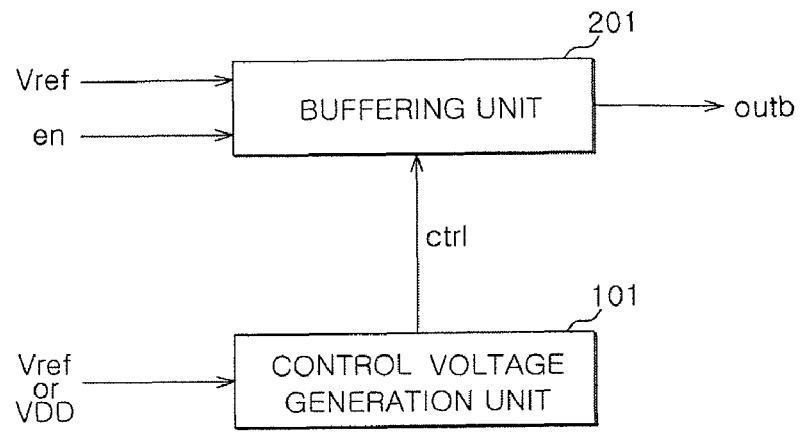
FIG. 5 is a schematic configuration diagram of an exemplary buffer circuit of a semiconductor memory apparatus according to another embodiment.

A buffer circuit of a semiconductor memory apparatus according to another embodiment can be configured to include a control voltage generation unit 101 and a buffering unit 201 as shown in FIG. 5. A voltage level of the reference voltage 'Vref' to be described below, as a voltage applied from the outside, increases when a level of an external voltage VDD increases and decreases when the level of the external voltage VDD decreases. At this time, it is assumed that the level of the reference voltage 'Vref' is a half the level of the external voltage VDD.

The control voltage generation unit 101 is configured to generate a control voltage 'ctrl' of which a voltage level decreases as the level of the external voltage VDD increases. That is, the control voltage generation unit 101 is configured to generate the control voltage 'ctrl' of which the voltage level decreases as the level of the reference voltage 'Vref' increases.

The buffering unit 201 is configured to generate an output signal 'outb' by receiving the reference voltage 'Vref' and buffering an input signal 'in'. The buffering unit 201 is configured to receive a larger amount of current as the level of the control voltage 'ctrl' decreases.

Figure 6:
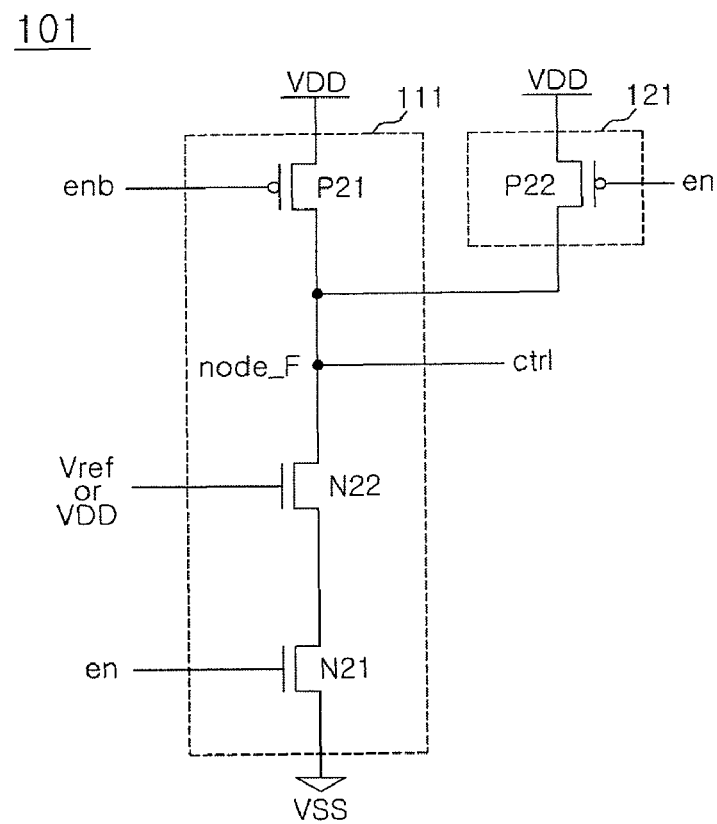
FIG. 6 is a configuration diagram of an exemplary control voltage generation unit of FIG. 5 according to one embodiment.

As shown in FIG. 6, the control voltage generation unit 101 can be configured to include a control voltage level adjusting unit 111 and an initialization unit 121.

The control voltage level adjusting unit 111 can be configured to include first to third transistors P21, N21, and N22. When an enable signal 'en' is enabled at a high level, the control voltage level adjusting unit 111 is activated. When the control voltage level adjusting unit 111 is activated, the control voltage level adjusting unit 111 is configured to generate the control voltage 'ctrl' of which the voltage level decreases as the level of the external voltage VDD or the reference voltage 'Vref' increases. At this time, the control voltage 'ctrl' is outputted from a first node node_F that is connected with the first and third transistors P21 and N22. Here, an inverted enable signal 'enb' is a signal inverting the enable signal 'en'.

The initialization unit 121 can be configured to include a fourth transistor P22. The initialization unit 121 can initialize the control signal 'ctrl' to the level of the external voltage VDD by applying the external voltage VDD to a first node node_F when the enable signal 'en' is disabled at a low level.

Figure 7:
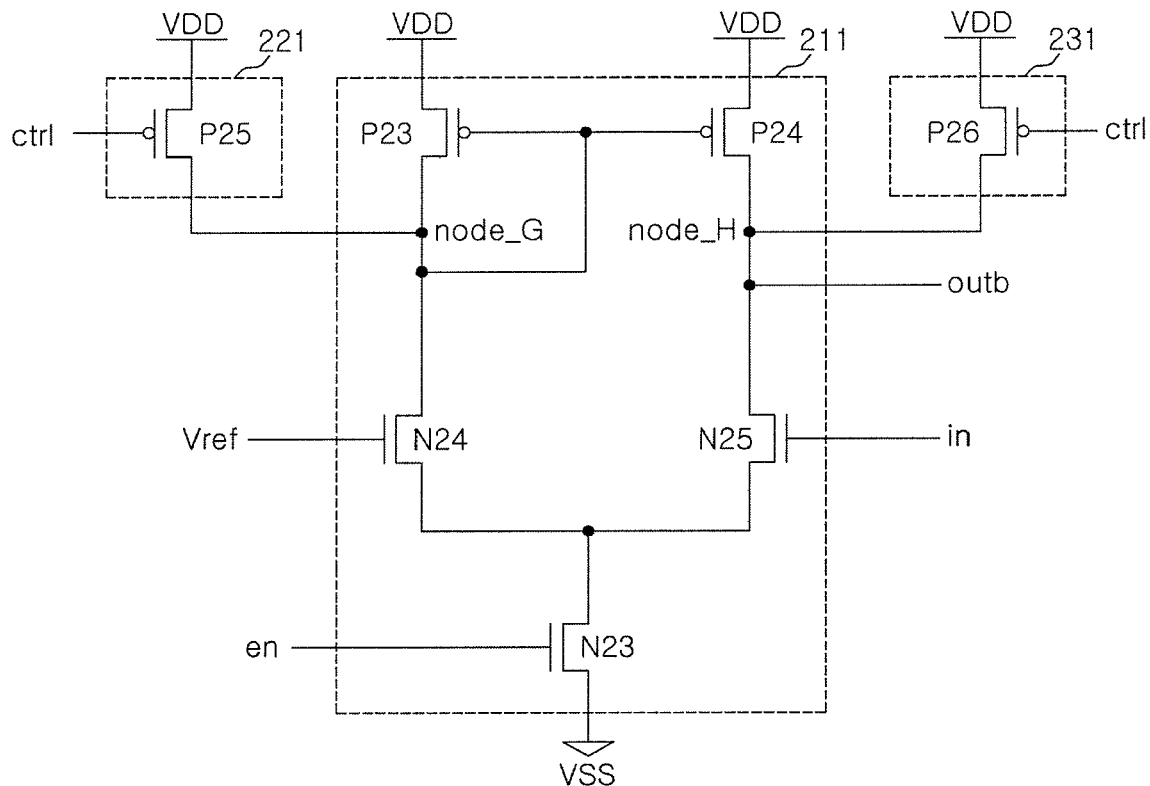
FIG. 7 is a configuration diagram of an exemplary buffering unit of FIG. 5 according to one embodiment.

As shown in FIG. 7, the buffering unit 201 can be configured to include a buffer 211, and first and second current source units 221 and 231.

The buffer 211 can include fifth to ninth transistors P23, P24, and N23 to N25. The buffer 211 is configured to generate the output signal 'outb' by buffering the input signal 'in' depending on the reference voltage 'Vref'. At this time, a node that is connected with the fifth transistor P23 and the eighth transistor N24 is referred to as a second node node_G and a node that is connected with the sixth transistor P24 and the ninth transistor N25 is referred to as a third node node_H. Further, the output signal 'outb' is outputted from the third node node_H.

The first current source unit 221 can increase an amount of current that is supplied to the buffer 211 as the level of the control voltage 'ctrl' decreases.

The first current source unit 221 can be configured to include a tenth transistor P25 and can increase an amount of current that flows on the second node node_G as the level of the control voltage 'ctrl' decreases.

The second current source unit 231 can increase the amount of current that is supplied to the buffer 211 as the level of the control voltage 'ctrl' decreases.

The second current source unit 231 can be configured to include an eleventh transistor P26 and can increase an amount of current that flows on the third node node_G as the level of the control voltage 'ctrl' decreases.

An exemplary operation of the buffer circuit of the semiconductor memory apparatus according to another embodiment will be described below. At this time, it is assumed that the level of the reference voltage 'Vref' is a half the level of the external voltage VDD. First, the problem with the buffer circuit shown in FIG. 1 will be described.

Figure 1:
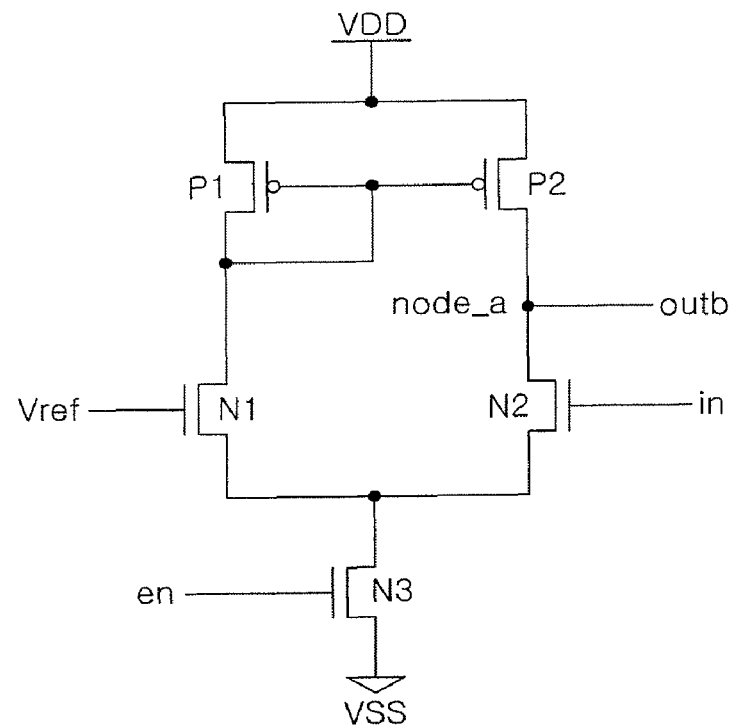
FIG. 1 is a configuration diagram of a known buffer circuit of a semiconductor memory apparatus.

For example, when the level of the external voltage VDD increases from 5 V to 10 V, the level of the reference voltage 'Vref' increases from 2.5 V to 5 V. Therefore, when the enable signal 'en' is enabled at the level of the external voltage VDD, the known buffer circuit receives a reference voltage 'Vref' of 5 V and an enable signal 'en' of 10 V. As shown in FIG. 1, an amount of current that is supplied to a node node_a from which the output signal 'outb' is outputted is proportional to the level of the reference voltage 'Vref' and an amount of current that flows on a ground terminal VSS is proportional to the voltage level of the enable signal 'en'. That is, when the level of the reference voltage 'Vref' increases to 2.5 V and the level of the external voltage VDD increases to 5 V, an amount of current that flows out to the ground terminal VSS increases to lengthen a section in which the output signal 'outb' is transited to a high level and shorten a section in which the output signal 'outb' is transited to a low level. That is, the known buffer circuit cannot perform a normal buffering operation when the level of the external voltage increases.

The buffer circuit of the semiconductor memory apparatus according to another embodiment is configured to generate the control voltage 'ctrl' of which the voltage level decreases as the level of the external voltage VDD or the reference voltage 'Vref' increases to supply a larger amount of current to the buffer 211.

That is, as the level of the external voltage VDD or the reference voltage 'Vref' increases, it is possible to compensate an amount of current that flows out from the second and third node node_G and node_H by increasing the amount of current that is supplied to the second and third node node_G and node_H of the buffer 211.

The buffer circuit of the semiconductor memory apparatus according to another embodiment can constantly maintain the transition section of the output signal even though the level of the external voltage or the level of the reference voltage increases.

Figure 8:
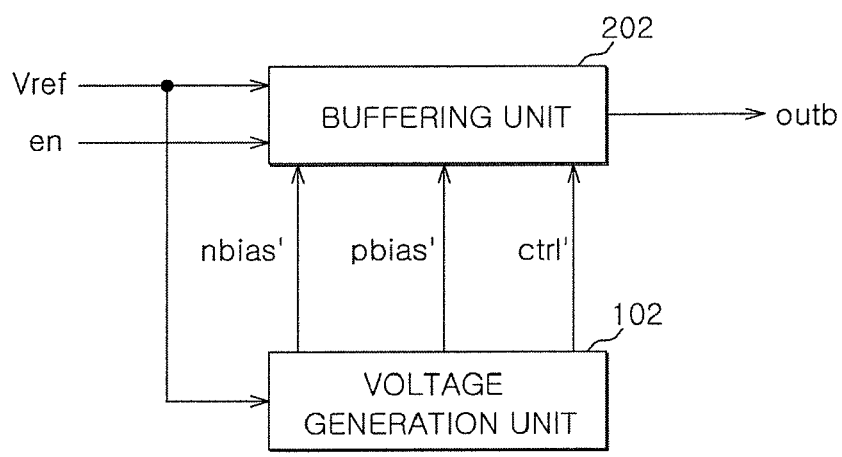
FIG. 8 is a schematic configuration diagram of an exemplary buffer circuit of a semiconductor memory apparatus according to yet another embodiment.

A buffer circuit of a semiconductor memory apparatus according to yet another embodiment can be configured to include a voltage generation unit 102 and a buffering unit 202 as shown in FIG. 8.

The voltage generation unit 102 is configured to generate first and second compensation voltages 'nbias" and 'pbias" depending on variation of a level of a reference voltage 'Vref' when an external voltage VDD has a voltage level within a tolerance and generate a control voltage 'ctrl" when the external voltage VDD is higher than the voltage level within the tolerance. At this time, it is assumed that the reference voltage 'Vref' is a voltage applied from the outside and the level of the reference voltage is a half the level of the external voltage VDD.

The buffering unit 202 is configured to generate an output signal 'outb' by buffering an input signal 'in' depending on the reference voltage 'Vref' and control an amount of current that flows in the buffering unit 202 depending on the levels of the first and second compensation voltages 'nbias" and 'pbias" and the control voltage 'ctrl".

Figure 9:
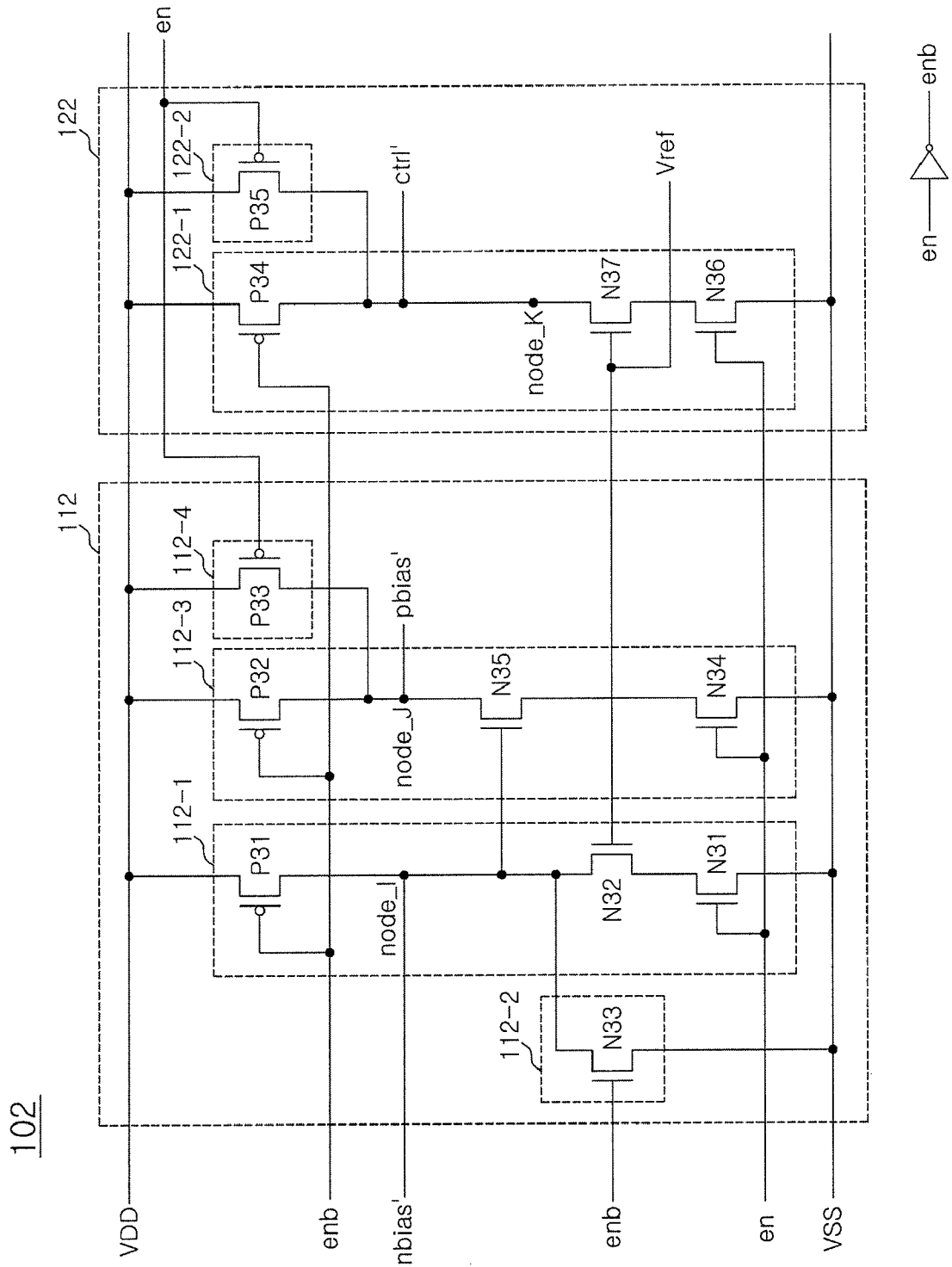
FIG. 9 is a configuration diagram of a voltage generation unit of FIG. 8 according to one embodiment.

As shown in FIG. 9, the voltage generation unit 102 can be configured to include a compensation voltage generation unit 112 and a control voltage generation unit 122.

The compensation voltage generation unit 112 can generate the first and second compensation voltages 'nbias" and 'pbias" depending on the variation of the reference voltage 'Vref' when the level of the external voltage VDD is within the tolerance.

The compensation voltage generation unit 112 can be configured to include a first compensation voltage generation portion 112-1, a first initialization portion 112-2, a second compensation voltage generation portion 112-3, and a second initialization portion 112-4.

The first compensation voltage generation portion 112-1 can be configured to include first to third transistors P31, N31, and N32. When an enable signal 'en' is enabled at a high level, the first compensation voltage generation portion 112-1 is configured to generate the first compensation voltage 'nbias" of which the voltage level decreases as the level of the reference voltage 'Vref' increases in the case in which the external voltage VDD has the voltage level within the tolerance. Further, the first compensation voltage generation portion 112-1 can increase the level of the first compensation voltage 'nbias" as the level of the reference voltage 'Vref' decreases in the case in which the level of the external voltage VDD is within the tolerance voltage level. At this time, in the case in which the level of the external voltage VDD becomes higher than the voltage level of the tolerance and as a result, the level of the reference voltage 'Vref' increases, the level of the first compensation voltage 'nbias" is fixed to a level of a ground voltage VSS. The first compensation voltage 'nbias" is outputted from a first node node_I that is connected with the first and third transistors P31 and N32.

The first initialization unit 112-1 can initialize the first node node_I to the level of the ground voltage VSS when an inverted enable signal 'enb' is at a high level, that is, the enable signal 'en' is disabled at a low level.

The first initialization portion 112-2 can be configured to include a fourth transistor N33. The first initialization portion 112-2 can connect a ground terminal VSS with the first node node_I when the inverted enable signal 'enb' is at a high level.

The second compensation voltage generation portion 112-3 can be configured to include fifth to seventh transistors P32, N34, and N35. When the enable signal 'en' is enabled at a high level, the second compensation voltage generation portion 112-3 is configured to generate the second compensation voltage 'pbias" of which the voltage level increases as the level of the reference voltage 'Vref' increases in the case in which the level of the external voltage VDD is within the tolerance. Further, the second compensation voltage generation portion 112-3 can decrease the level of the second compensation voltage 'pbias" as the level of the reference voltage 'Vref' decreases in the case in which the level of the external voltage VDD is within the tolerance voltage level. At this time, in the case in which the level of the external voltage VDD becomes higher than the tolerance voltage level and as a result, the level of the reference voltage 'Vref' increases, the level of the second compensation voltage 'pbias" is fixed to the level of the external voltage VDD. The second compensation voltage 'pbias" is outputted from a second node node_J that is connected with the fifth and seventh transistors P32 and N35.

The second initialization portion 112-4 can initialize the second node node_J to the level of the external voltage VDD when the enable signal 'en' is disabled at a low level.

The second initialization portion 112-4 can be configured to include an eighth transistor P33. The second initialization portion 112-4 can connect an external voltage terminal VDD to the second node node_J when the enable signal 'en' is at a low level.

The control voltage generation unit 122 can be configured to include a control voltage level adjusting portion 122-1 and a third initialization portion 122-2.

The control voltage level adjusting portion 122-1 can be configured to include ninth to eleventh transistors P34, N36, and N37. When the enable signal 'en' is enabled at a high level, the control voltage level adjusting portion 122-1 is configured to generate the control voltage 'ctrl" of which the voltage level decreases as the level of the external voltage VDD or the reference voltage 'Vref' increases. At this time, the control voltage 'ctrl" is outputted from a third node node_K that is connected with the ninth and eleventh transistors P34 and N37.

The third initialization portion 122-2 can be configured to include a twelfth transistor P35. The third initialization portion 122-2 can initialize the control voltage 'ctrl" to the level of the external voltage VDD when the enable signal 'en' is disabled at a low level.

Figure 10:
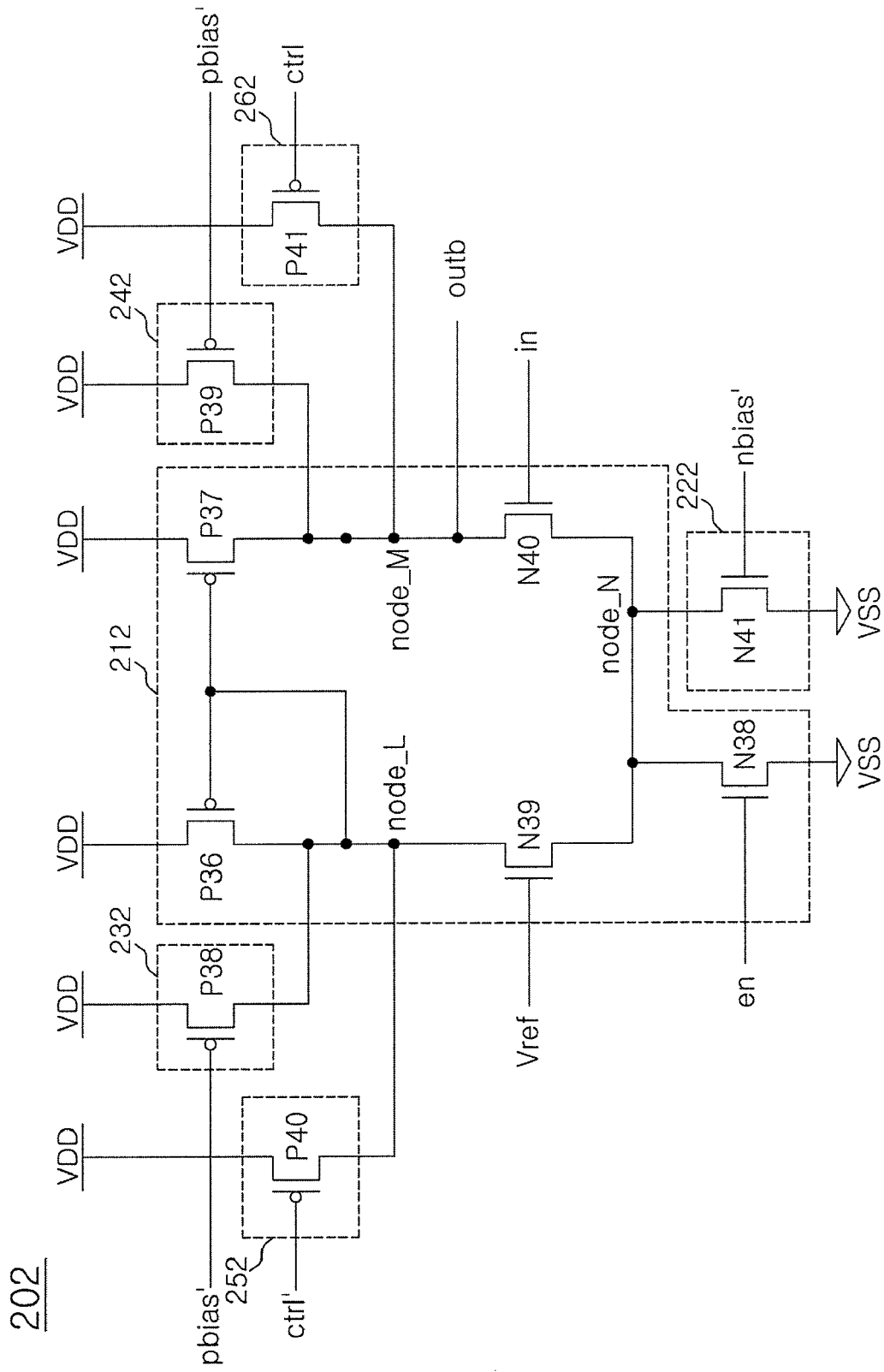
FIG. 10 is a configuration diagram of an exemplary buffering unit of FIG. 8 according to one embodiment.

As shown in FIG. 10, the buffering unit 202 can be configured to include a buffer 212, a current sink unit 222, and first to fourth current source units 232 and 262.

The buffer 212 can be configured to include thirteenth to seventeenth transistors P36, P37, and N38 to N40. The buffer 212 can generate the output signal 'outb' by buffering the input signal 'in' depending on the reference voltage 'Vref'. At this time, a node that is connected with the thirteenth and sixteenth transistors P36 and N39 is referred to as a fourth node node_L, a node that is connected with the fourteenth and seventeenth transistors P37 and N40 is referred to as a fifth node node_M, and a node that is connected with the fifteenth to seventeenth N38 to N40 is referred to as a sixth node node_N. The output signal 'outb' is outputted from the fifth node node_M.

The current sink unit 222 can increase an amount of current that flows to the ground terminal VSS from the buffer 212 when the level of the first compensation voltage 'nbias" increases.

The current sink unit 222 can be configured to include an eighteenth transistor N41. The current sink unit 220 is configured to increase an amount of current that flows to the ground terminal VSS from the sixth node node_N when the level of the first compensation voltage 'nbias" increases.

The first current source unit 232 can increase the amount of current that is supplied to the buffer 212 when the level of the second compensation voltage 'pbias" decreases.

The first current source unit 232 can be configured to include a ninth transistor P38. The first current source unit 232 is configured to increase an amount of current that is supplied to the fourth node node_L when the level of the second compensation voltage 'pbias" decreases.

The second current source unit 242 can increase the amount of current that is supplied to the buffer 212 when the level of the second compensation voltage 'pbias" decreases.

The second current source unit 242 can be configured to include a twentieth transistor P39. The second current source unit 242 is configured to increase an amount of current that is supplied to the fifth node node_M when the level of the second compensation voltage 'pbias" decreases.

The third current source unit 252 can increase the amount of current that is supplied to the buffer 212 when the level of the control voltage 'ctrl" decreases.

The third current source unit 252 can be configured to include a twenty-first transistor P40. The third current source unit 252 is configured to increase the amount of current that is supplied to the fourth node node_L when the level of the control level 'ctrl" decreases.

The fourth current source unit 262 can increase the amount of current that is supplied to the buffer 212 when the level of the control voltage 'ctrl" decreases.

The fourth current source unit 262 can be configured to include a twenty-second transistor P41. The fourth current source unit 262 is configured to increase the amount of current that is supplied to the fifth node node_M when the level of the control level 'ctrl" decreases.

An exemplary operation of the buffer circuit of the semiconductor memory apparatus according to yet another embodiment will be described below.

The buffer circuit of the semiconductor memory apparatus according to yet another embodiment can constantly maintain the transition section of the output signal 'outb' of the buffer circuit by generating the first and second compensation voltages 'nbias" and 'pbias" of which voltage levels vary depending on variation of the level of the reference voltage 'Vref' when the external voltage VDD is at the tolerance voltage level.

More specifically, in the case in which the external voltage VDD is within the allowance voltage level, the level of the first compensation voltage 'nbias" increases and the level of the second compensation voltage 'pbias" decreases when the level of the reference voltage 'Vref' decreases. The amount of current that flows in the buffer 212 can be constantly maintained depending on the levels of the first and second compensation voltages 'nbias" and 'pbias" to thereby maintain a constant transition section of the output signal 'outb'.

In the case of the buffer circuit shown in FIG. 1, when the level of the reference voltage 'Vref' decreases, the amount of current that flows in the buffer circuit decreases. However, in the case of the buffer circuit, when the level of the first compensation voltage 'nbias" increases and the level of the second compensation voltage 'pbias" decreases, such that the current sink unit 222 and the first and second current source units 232 and 242 compensate the amount of current that flows in the buffer 212 as large as a decreased current amount. Accordingly, a constant amount of current flows in the buffer 212, such that the buffer 212 can constantly maintain the transition section of the output signal 'outb'.

In the case in which the external voltage VDD is within the allowance voltage level, the level of the first compensation voltage 'nbias" decreases and the level of the second compensation voltage 'pbias" increases when the level of the reference voltage 'Vref' increases. The amount of current that flows in the buffer 212 is constantly maintained depending on the levels of the first and second compensation voltages 'nbias" and 'pbias" to thereby maintain the constant transition section of the output signal 'outb'.

In the case of the buffer circuit shown in FIG. 1, when the level of the reference voltage 'Vref' increases, the amount of current that flows in the buffer circuit increases. However, in the case of the buffer circuit, when the level of the first compensation voltage 'nbias" decreases and the level of the second compensation voltage 'pbias" increases, such that the current sink unit 222 and the first and second current source units 232 and 242 compensate the amount of current that flows in the buffer 212 as large as an increased current amount. Accordingly, a constant amount of current flows in the buffering unit 212, such that the buffer 212 can constantly maintain the transition section of the output signal 'outb'.

The buffer circuit of the semiconductor memory apparatus according to yet another embodiment can constantly maintain the transition section of the output signal 'outb' by generating the control voltage 'ctrl" of which the voltage level varies depending the variation of the level of the external voltage VDD or the reference voltage 'Vref' when the external voltage VDD is higher than the allowance voltage level.

When the level of the external voltage VDD is higher than the allowance voltage level, the level of the reference level 'Vref' also increases. In this case, when the level of the reference voltage 'Vref' increases, the third transistor N32 shown in FIG. 9 is completely turned on and the seventh transistor N35 is completely turned off, such that the first compensation voltage 'nbias" is fixed to the level of the ground voltage VSS and the second compensation voltage 'pbias" is fixed to the level of the external voltage VDD. As a result, the current sink unit 222 and the first and second current source units 232 and 242 interrupt a current path of the buffer 212.

However, when the level of the reference voltage 'Vref' increases as the external voltage VDD increases, a turn-on level of the eleventh transistor N37 constituting the control voltage generation unit 122 increases. Therefore, when the level of the reference voltage 'Vref' increases, the level of the control voltage 'ctrl" decreases.

In the case of the buffer circuit shown in FIG. 1, when the external voltage VDD is higher than the allowance voltage level, the amount of current that is supplied to the node node_a outputting the output signal 'outb' becomes more than an amount of current that flows out. Therefore, when the external voltage VDD is higher than the allowance voltage level, the section in which the output signal 'outb' is transited to a high level is lengthened.

However, the buffer circuit of the semiconductor memory apparatus according to yet another embodiment can constantly maintain the transition section of the output signal 'outb' by increasing the amount of supplied current by generating the control voltage 'ctrl" of which the voltage level decreases as the level of the reference voltage 'Vref' increases.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A buffer circuit of a semiconductor memory apparatus, comprising:
   a compensation voltage generation unit configured to receive a reference voltage and generate a compensation voltage in response to the level of a reference voltage; and
   a buffering unit configured to receive the reference voltage, determine a voltage level of an output signal depending on whether a voltage level of an input signal is higher or lower than a level of the reference voltage and control a transition section of the output signal depending on a level of the compensation voltage.

2. The buffer circuit of claim 1, wherein the compensation voltage generation unit is configured to increase the level of the compensation voltage when the level of the reference voltage decreases.

3. The buffer circuit of claim 2, wherein the buffering unit is configured to increase an amount of current that flows to a ground terminal when the level of the compensation voltage increases.

4. The buffer circuit of claim 3, wherein the buffering unit is configured to decrease the transition section of the output signal when the amount of current that flows to the ground terminal increases.

5. The buffer circuit of claim 1, wherein the compensation voltage generation unit is configured to decrease the level of the compensation voltage when the level of the reference voltage increases.

6. The buffer circuit of claim 5, wherein the buffering unit is configured to decrease an amount of current that is supplied from a power supply terminal when the level of the compensation voltage decreases.

7. The buffer circuit of claim 6, wherein the buffering unit is configured to increase the transition section of the output signal when the amount of the current decreases.

8. The buffer circuit of claim 1, wherein the compensation voltage includes a first compensation voltage and a second compensation voltage, and
wherein the compensation voltage generation unit is configured to increase a level of the first compensation voltage and decrease a level of the second compensation voltage when the level of the reference voltage decreases.

9. The buffer circuit of claim 8, wherein the buffering unit is configured to increase an amount of current that flows to a ground terminal when the level of the first compensation voltage increases and increase an amount of current that is supplied from a power supply terminal when the level of the second compensation voltage decreases.

10. The buffer circuit of claim 9, wherein the buffering unit is configured to decrease the transition section of the output signal when the amount of current that flows to the ground terminal and the amount of the current supplied from the power supply terminal increases.

11. The buffer circuit of claim 1, wherein the compensation voltage includes a first compensation voltage and a second compensation voltage, and
wherein the compensation voltage generation unit is configured to decrease a level of the first compensation voltage and increase a level of the second compensation voltage when the level of the reference voltage increases.

12. The buffer circuit of claim 11, wherein the buffering unit is configured to decrease an amount of current that flows to a ground terminal and decrease an amount of current that is supplied from a power supply terminal when the level of the first compensation voltage decreases.

13. The buffer circuit of claim 12, wherein the buffering unit is configured to increase the transition section of the output signal when the amount of current that flows to the ground terminal decreases and the amount of the current supplied from the power supply terminal decreases.

14. A buffer circuit of a semiconductor memory apparatus, comprising:
a control voltage generation unit configured to receive a reference voltage and generate a control voltage of which a voltage level decreases as the reference voltage is higher than a tolerance voltage level; and
a buffering unit configured to receive a reference voltage, determine a voltage level of an output signal depending on whether a voltage level of an input signal is higher or lower than a level of the reference voltage and increase an amount of supplied current as the voltage level of the control voltage decreases.

15. The buffer circuit of claim 14, wherein the reference voltage, as a voltage inputted from the outside, is a voltage of which a level increases when a level of an external voltage increases.

16. The buffer circuit of claim 15, wherein the control voltage generation unit is configured to generate the control voltage of which the voltage level decreases as the level of the reference voltage increases.

17. The buffer circuit of claim 16, wherein the buffering unit includes:
a buffer configured to generate the output signal by buffering the input signal depending on the reference voltage; and
a current source unit configured to control an amount of current that is supplied to the buffer depending on the voltage level of the control voltage.

18. The buffer circuit of claim 17, wherein the current source unit is configured to increase the amount of current that is supplied to the buffer when the voltage level of the control voltage decreases.

19. A buffer circuit of a semiconductor memory apparatus, comprising:
a voltage generation unit configured to receive a reference voltage, and generate a compensation voltage depending on variation of a level of the reference voltage when an external voltage is at a voltage level within a tolerance and to generate a control voltage when the external voltage is at a voltage level larger than the tolerance; and
a buffering unit configured to receive the reference voltage, determine a voltage level of an output signal depending on whether a voltage level of an input signal is higher or lower than a level of the reference voltage and control an amount of current that flows in the buffering unit depending on at least one of the compensation voltage and the control voltage.

20. The buffer circuit of claim 19, wherein the reference voltage is a voltage applied from outside of the semiconductor memory apparatus, and
wherein the level of the reference voltage increases as the voltage level of the external voltage increases and when the voltage level of the external voltage decreases, the level of the reference voltage also decreases.

21. The buffer circuit of claim 20, wherein the voltage generation unit includes:
a compensation voltage generation unit configured to generate the compensation voltage depending on the variation of the level of the reference voltage when the external voltage is within the tolerance; and
a control voltage generation unit configured to generate the control voltage when the external voltage is higher than the tolerance.

22. The buffer circuit of claim 21, wherein the compensation voltage generation unit is configured to fix the compensation voltage to a predetermined voltage level when the external voltage is higher than the tolerance.

23. The buffer circuit of claim 22, wherein the compensation voltage generation unit is configured to increase the level of the compensation voltage when the level of the reference voltage decreases in the case in which the external voltage is at the tolerance.

24. The buffer circuit of claim 23, wherein the buffering unit is configured to increase an amount of current that flows to a ground terminal when the level of the compensation voltage increases.

25. The buffer circuit of claim 24, wherein the buffering unit includes:
 a buffer configured to generate the output signal by buffering the input signal depending on the reference voltage; and
 a current sink unit configured to increase an amount of current that flows from the buffer to the ground terminal as the level of the compensation voltage increases.

26. The buffer circuit of claim 22, wherein the compensation voltage generation unit is configured to decrease the level of the compensation voltage when the level of the reference voltage increase in the case in which the external voltage is at the tolerance.

27. The buffer circuit of claim 26, wherein the buffering unit is configured to increase an amount of current that is supplied from a power supply terminal when the level of the compensation voltage decreases.

28. The buffer circuit of claim 27, wherein the buffering unit includes:
 a buffer configured to generate the output signal by buffering the input signal depending on the reference voltage; and
 a current source unit configured to increase the amount of current that is supplied to the buffer when the level of the compensation voltage decreases.

29. The buffer circuit of claim 22, wherein the compensation voltage includes a first compensation voltage and a second compensation voltage, and
 wherein the compensation voltage generation unit is configured to increase a level of the first compensation voltage and decrease a level of the second compensation voltage when the level of the reference voltage decreases in the case in which the external voltage is at the tolerance.

30. The buffer circuit of claim 29, wherein the compensation voltage generation unit is configured to decrease the level of the first compensation voltage and increase the level of the second compensation voltage when the level of the reference voltage increases in the case in which the external voltage is at the tolerance.

31. The buffer circuit of claim 30, wherein the compensation voltage generation unit is configured to fix the first compensation voltage to a level of a ground voltage and the second compensation voltage to a level of the external voltage when the external voltage is higher than the tolerance.

32. The buffer circuit of claim 31, wherein the buffering unit includes:
 a buffer configured to generate the output signal by buffering the input signal depending on the reference voltage;
 a current sink unit configured to increase an amount of current that flows from the buffer to a ground terminal when the level of the first compensation voltage increases; and
 a current source unit configured to increase an amount of current that is supplied to the buffer when the level of the second compensation voltage decreases.

33. The buffer circuit of claim 21, wherein the control voltage generation unit is configured to decrease a level of the control voltage when the level of the external voltage is higher than the tolerance and as a result, the level of the reference voltage increases.

34. The buffer circuit of claim 33, wherein the buffering unit includes:
 a buffer configured to generate the output signal by buffering the input signal depending on the reference voltage; and
 a current source unit configured to increase an amount of current that is supplied to the buffer when the level of the control voltage decreases.

35. The buffer circuit of claim 22, wherein the compensation voltage includes a first compensation voltage and a second compensation voltage, and
 wherein the compensation voltage generation unit is configured to increase a level of the first compensation voltage and decrease a level of the second compensation voltage when the level of the reference voltage decreases and decrease the level of the first compensation voltage and increase the level of the second compensation voltage when the level of the reference voltage increases in the case in which the external voltage is within the tolerance.

36. The buffer circuit of claim 35, wherein the buffering unit includes:
 a buffer configured to generate the output signal by buffering the input signal depending on the reference voltage;
 a current sink unit configured to increase an amount of current that flows from the buffer to a ground terminal when the level of the first compensation voltage increases;
 a first current source unit configured to increase an amount of current that is supplied to the buffer when the level of the second compensation voltage decrease; and
 a second current source unit configured to increase the amount of current that is supplied to the buffer when a level of the control voltage decreases.

* * * * *